United States Patent
Wolf et al.

(10) Patent No.: US 10,297,441 B2
(45) Date of Patent: May 21, 2019

(54) LOW-TEMPERATURE ATOMIC LAYER DEPOSITION OF BORON NITRIDE AND BN STRUCTURES

(71) Applicants: Applied Materials, Inc., Santa Clara, CA (US); The Regents of the University of California, Oakland, CA (US)

(72) Inventors: Steven Wolf, San Diego, CA (US); Mary Edmonds, San Diego, CA (US); Andrew C. Kummel, San Diego, CA (US); Srinivas D. Nemani, Sunnyvale, CA (US); Ellie Y. Yieh, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/674,108

(22) Filed: Aug. 10, 2017

(65) Prior Publication Data
US 2018/0040476 A1    Feb. 8, 2018

Related U.S. Application Data

(60) Provisional application No. 62/372,052, filed on Aug. 8, 2016.

(51) Int. Cl.
| | |
|---|---|
| H01L 21/44 | (2006.01) |
| H01L 21/31 | (2006.01) |
| H01L 21/469 | (2006.01) |
| H01L 29/76 | (2006.01) |
| H01L 29/94 | (2006.01) |

(Continued)

(52) U.S. Cl.
CPC ...... *H01L 21/02205* (2013.01); *C23C 16/342* (2013.01); *C23C 16/45527* (2013.01); *C23C 16/45553* (2013.01); *C23C 16/46* (2013.01); *H01L 21/0228* (2013.01); *H01L 21/02112* (2013.01); *H01L 21/02175* (2013.01); *H01L 29/513* (2013.01); *H01L 29/517* (2013.01); *H01L 29/518* (2013.01)

(58) Field of Classification Search
CPC .................. H01L 21/02205; C23C 16/342
USPC ................ 257/411; 438/680, 788, 792
See application file for complete search history.

(56) References Cited

U.S. PATENT DOCUMENTS

| | | |
|---|---|---|
| 6,740,977 B2 | 5/2004 | Ahn et al. |
| 6,815,350 B2 | 11/2004 | Kim et al. |

(Continued)

OTHER PUBLICATIONS

Snure, M., et al., Optical characterization of nanocrystalline boron nitride thin films grown by atomic layer deposition. Thin Solid Films, 2014. 571, Part 1: p. 51-55.

(Continued)

*Primary Examiner* — David S Blum
(74) *Attorney, Agent, or Firm* — Patterson + Sheridan LLP

(57) ABSTRACT

Methods of the disclosure include a BN ALD process at low temperatures using a reactive nitrogen precursor, such as thermal $N_2H_4$, and a boron containing precursor, which allows for the deposition of ultra thin (less than 5 nm) films with precise thickness and composition control. Methods are self-limiting and provide saturating atomic layer deposition (ALD) of a boron nitride (BN) layer on various semiconductors and metallic substrates.

12 Claims, 11 Drawing Sheets
(11 of 11 Drawing Sheet(s) Filed in Color)

(51) Int. Cl.
| | |
|---|---|
| *H01L 31/062* | (2012.01) |
| *H01L 31/113* | (2006.01) |
| *H01L 31/119* | (2006.01) |
| *H01L 21/02* | (2006.01) |
| *H01L 29/51* | (2006.01) |
| *C23C 16/46* | (2006.01) |
| *C23C 16/455* | (2006.01) |
| *C23C 16/34* | (2006.01) |

(56) References Cited

U.S. PATENT DOCUMENTS

| | | | | |
|---|---|---|---|---|
| 7,648,927 B2* | 1/2010 | Singh | ............... | C23C 16/0227 257/E21.12 |
| 2007/0128858 A1* | 6/2007 | Haukka | ............... | C23C 16/34 438/656 |
| 2010/0062149 A1* | 3/2010 | Ma | ............... | C23C 16/45534 427/126.1 |
| 2010/0108982 A1* | 5/2010 | Ping | ............... | B82Y 10/00 257/5 |
| 2011/0299720 A1* | 12/2011 | Nolen | ............... | G01N 21/25 382/100 |
| 2015/0099360 A1* | 4/2015 | Yieh | ............... | H01L 21/823462 438/690 |

OTHER PUBLICATIONS

Ferguson, J., A. Weimer, and S. George, Atomic layer deposition of boron nitride using sequential exposures of BCl3 and NH3. Thin Solid Films, 2002. 413(1): p. 16-25.

Olander, J., et al., Laser-Assisted Atomic Layer Deposition of Boron Nitride Thin Films. Chemical Vapor Deposition, 2005. 11(6-7): p. 330-337.

Mårlid, B., et al., Atomic layer deposition of Bn thin films. Thin Solid Films, 2002. 402(1): p. 167-171.

Haider, A., et al., Low-Temperature Deposition of Hexagonal Boron Nitride via Sequential Injection of Triethylboron and N2/H2 Plasma. Journal of the American Ceramic Society, 2014. 97(12): p. 4052-4059.

Cassabois, G., P. Valvin, and B. Gil, Hexagonal boron nitride is an indirect bandgap semiconductor. arXiv preprint arXiv:1512.02962, 2015.

Bath, A., et al., Plasma enhanced chemical vapor deposition and characterization of boron nitride gate insulators on InP. Journal of Applied Physics, 1991. 70(8): p. 4366-4370.

Liu, Z., et al., Direct Growth of Graphene/Hexagonal Boron Nitride Stacked Layers. Nano Letters, 2011. 11(5): p. 2032-2037.

* cited by examiner

LOW-TEMPERATURE ATOMIC LAYER DEPOSITION OF BORON NITRIDE AND BN STRUCTURES

CROSS-REFERENCE TO RELATED APPLICATIONS

This applications claims benefit of U.S. Provisional Patent Application Ser. No. 62/372,052, filed Aug. 8, 2016, which is herein incorporated by reference.

FIELD

A field of the disclosure is boron nitride deposition. Additional fields of the disclosure include high temperature ceramics, lubricants, and semiconductor fabrication, and particularly the deposition of ultra-thin oxides. Example technologies that can employ a high quality ALD boron nitride layer of the disclosure include insulating layers in a MISFET (metal-insulator-semiconductor field effect transistor), interconnect covering, such as copper, to help prevent power loss, lower resistivity, and prevent interconnect failure from power overloading. Other applications include finFETs, DRAM, flash memory, etc. Additional applications include as an interfacial layer of amorphous or crystalline BN that is deposited prior to dielectric deposition in MOSFET (metal-oxide-semiconductor FET) device architectures to prevent substrate diffusion into the high k material, thereby producing a device with a lower density of interfacial traps (Dit).

BACKGROUND

Nitrides are normally deposited using an activated $NH_3$ source, such as a plasma source, usually at high substrate temperatures in excess of 500° C. Previous work has shown that ALD occurs at 600° C.-900° C. with a growth rate of 0.7 Å/cycle on sapphire and Si [1]. Above this window, the process was not self limiting. The precursors were triethylborane and ammonia with $H_2$ carrier gas. George and coworkers showed that ALD with a growth rate of ~1 Å/cycle of BN with $BCl_3$ and $NH_3$ on $ZrO_2$ nanoparticles was possible at 500K, but it was likely with very large exposures. The process was low temperature, but the substrate was $ZrO_2$ [2]. There has also been reports of laser-assisted ALD of BN using $BBr_3$ and $NH_3$ [3], as well as amorphous growth at 400° C. and turbostratic growth at 750° C. [4]. There are a couple patents from Samsung [5, 6] that discuss forming SiBN thin films with three precursors as well as forming nano-laminate structures of $Si_3N_4$ and BN, but these mainly discuss the formation of the films and nano-laminate structures using activated $NH_3$ species or only on semiconducting substrates. There has also been recent work that shows low temperature ALD of hexagonal BN, but using an activated $N_2/H_2$ plasma [7].

BRIEF DESCRIPTION OF THE FIGURES

The patent or application file contains at least one drawing executed in color. Copies of this patent or patent application publication with color drawings will be provided by the Office upon request and payment of the necessary fee.

DETAILED DESCRIPTION OF THE EMBODIMENTS

Methods of the disclosure include a BN ALD process at low temperatures using a reactive nitrogen precursor, such as thermal $N_2H_4$, and a boron containing precursor, which allows for the deposition of ultra thin (less than 5 nm) films with precise thickness and composition control. Methods are self-limiting and provide saturating atomic layer deposition (ALD) of a boron nitride (BN) layer on various semiconductors and metallic substrates. The ALD occurs from the sequential exposures of a reactive nitrogen containing precursor such as hydrazine ($N_2H_4$) and a boron containing precursor. These precursors include, but are not limited to $BCl_3$, $BBr_3$, $BF_3$, $B_2H_6$, borazine $(BH)_3(NH)_3$, as well as tris(dimethylamino)borane (TDMAB) and related organometallic compounds. The substrates that BN ALD can be performed on include, but are not limited to, semiconductors such as silicon, silicon germanium (SiGe), indium gallium arsenide (InGaAs), indium gallium antiminide (InGaSb), or indium gallium nitride (InGaN), with each compound substrate having varying alloy compositions. In addition, 2-dimensional semiconductor substrates such as highly ordered pyrolytic graphite (HOPG) and molybdenum disulfide ($MoS_2$), as well as metallic substrates, such as copper, can be used.

BN (boron nitride) formed by a method of the disclosure can be an amorphous material. Amorphous BN acts as a diffusion barrier, and is especially useful on copper. BN can be formed via the disclosure in a crystalline form such as hexagonal or cubic. Crystalline BN has useful properties including high thermal conductivity, high chemical stability, a relatively low dielectric constant, and a wide bandgap.

Embodiments will be discussed with respect to experiments. Artisans will appreciate broader aspects and variations of the disclosure from the description of experiments.

Experiments have shown that depositing a thin (~0.5 nm) interfacial layer of BN in a MOS architecture can lower Dit when compared to a similar device without the interfacial BN layer. The deposited films are uniform and pinhole free, a crucial requirement for ALD reactions, particularly in nm-sized devices. The deposited films are able to nucleate $Al_2O_3$ and are assumed to be able to nucleate any other gate oxides such as $HfO_2$, $ZrO_2$, and HfZrO. In effect, BN ALD has the ability to functionalize, passivate, and nucleate growth in each and every unit cell. Experiments also demonstrated a device with an interfacial layer of ~0.5 nm BN with $Al_2O_3$ gate oxide. In addition, a device with ~5 nm BN was fabricated on SiGe to see if a pinhole free film of BN was deposited. Atomic force microscopy (AFM) confirmed the presence of a uniform, pinhole free BN film. Deposition was also demonstrated on copper.

Figure 1:
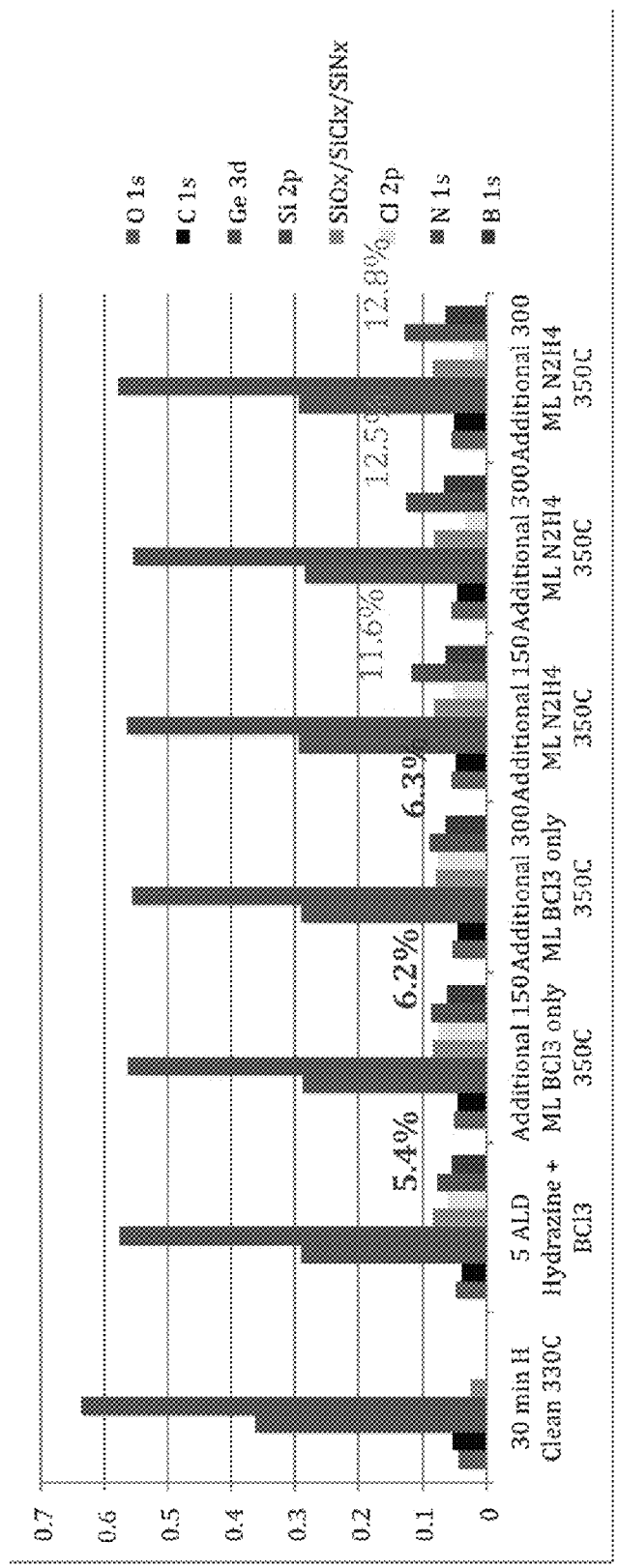
FIG. 1 shows XPS spectra for clean SiGe followed by ALD cycles and subsequent saturation exposure of $BCl_3$ and $N_2H_4$.

FIG. 1: XPS spectra for clean SiGe followed by ALD cycles and subsequent saturation exposure of $BCl_3$ and $N_2H_4$. The relatively unchanged percentages of boron after the additional 300 ML $BCl_3$ and nitrogen after the last additional exposure of 300 ML $N_2H_4$ indicate the saturation behavior of the ALD process. The data is normalized to the intensity of the Si 2p+Ge 3 d+N 1 s+B 1 s signals, as well as all peaks being corrected by Schofield photoionization cross sectional relative sensitivity factors.

Figure 2:
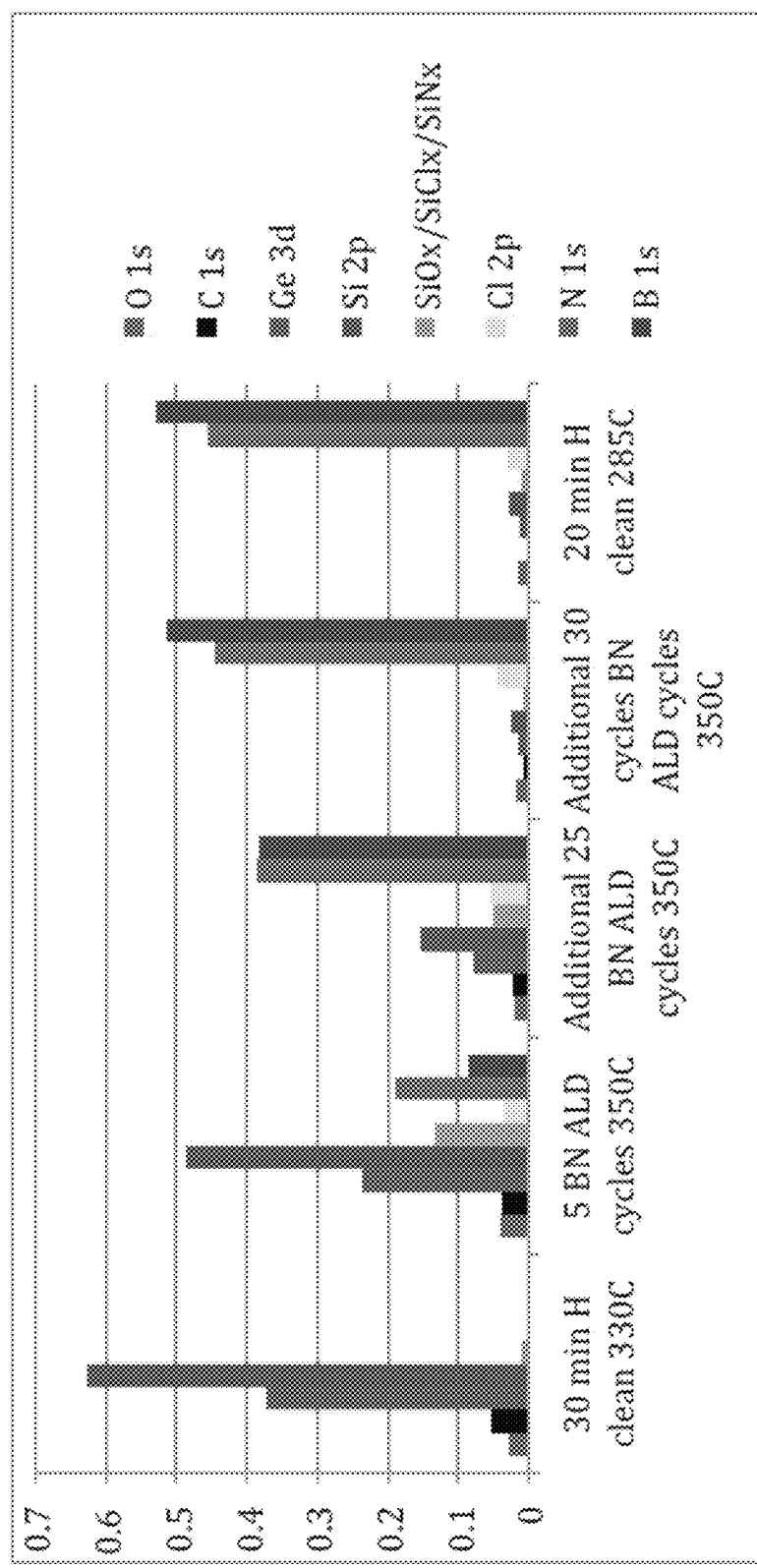
FIGS. 2 and 3 show a SiGe wafer that ultimately had 60 total cycles of BN deposited.
Figure 3:
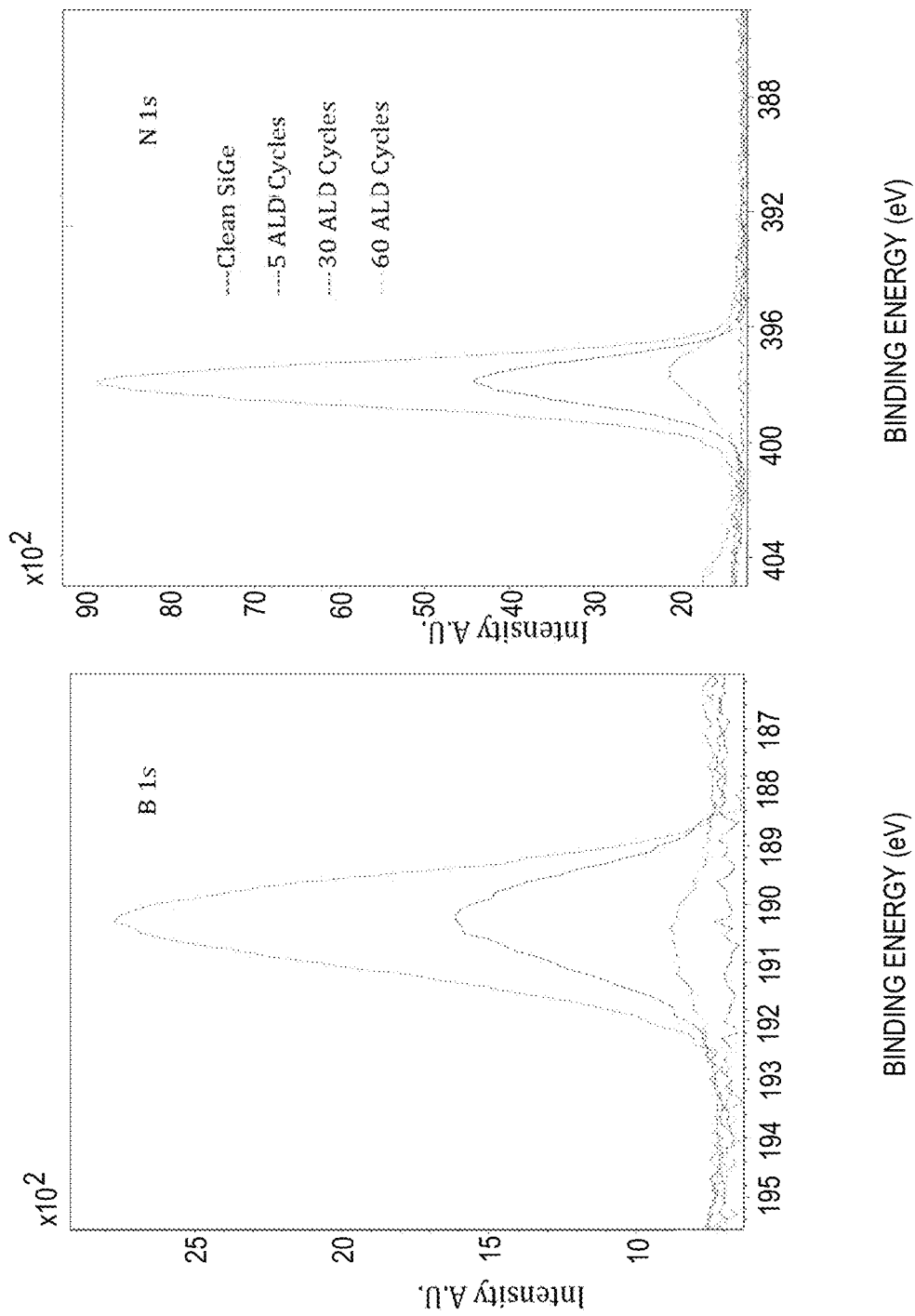

FIGS. 2 and 3 show a SiGe wafer that ultimately had 60 total cycles of BN deposited. The thickness of this film was estimated at 5 nm using the attenuation of the substrate signals in XPS. The final H clean is merely to remove excess Cl from the surface after the completion of the cycles. This final removal of Cl may help prevent contamination and unwanted reactions with the surface when the sample is exposed to the air. The ratio of the N 1 s signal to the B 1 s signal is nearly 1:1 indicating the film has grown nearly stoichiometric. FIG. 3 shows the raw data of the B 1 s and N 1 s signal that increases as a function of the number of cycles.

Figure 4:
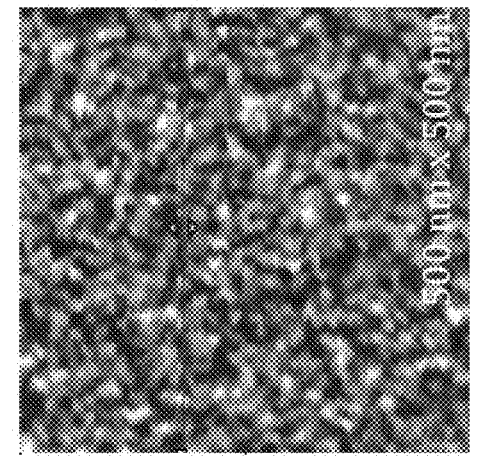
FIG. 4 shows AFM (atomic force microscopy) images of the 5 nm sample whose XPS data is shown in FIGS. 2 and 3.
Figure 4:
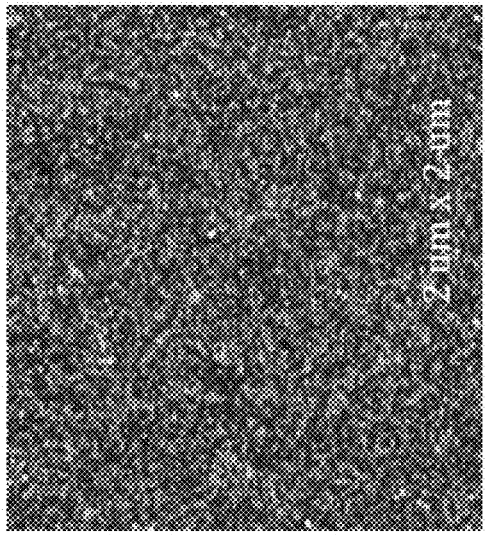
Figure 4:
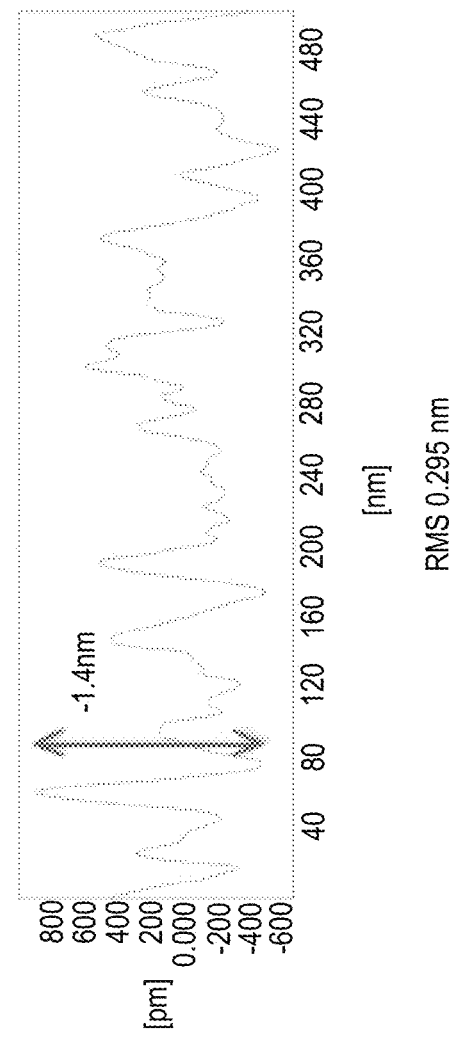

FIG. 4 shows AFM (atomic force microscopy) images of the 5 nm sample whose XPS data is shown in FIGS. 2 and 3. The film is very uniform and shows a root mean square surface roughness of 0.295 nm. The maximum feature height seen is ~1.4 nm, which indicates the film, is pinhole free. A pinhole free film is required by ALD processes on nm-scale devices in order to achieve working devices with low gate leakage.

FIG. 4: AFM images 2×2 um and 500 nm×500 nm showing a uniform film of 5 nm BN was deposited. The corresponding line trace indicates a max height of 1.4 nm, which is below the 5 nm of BN deposited. This indicates the film does not contain any pinholes.

Figure 5:
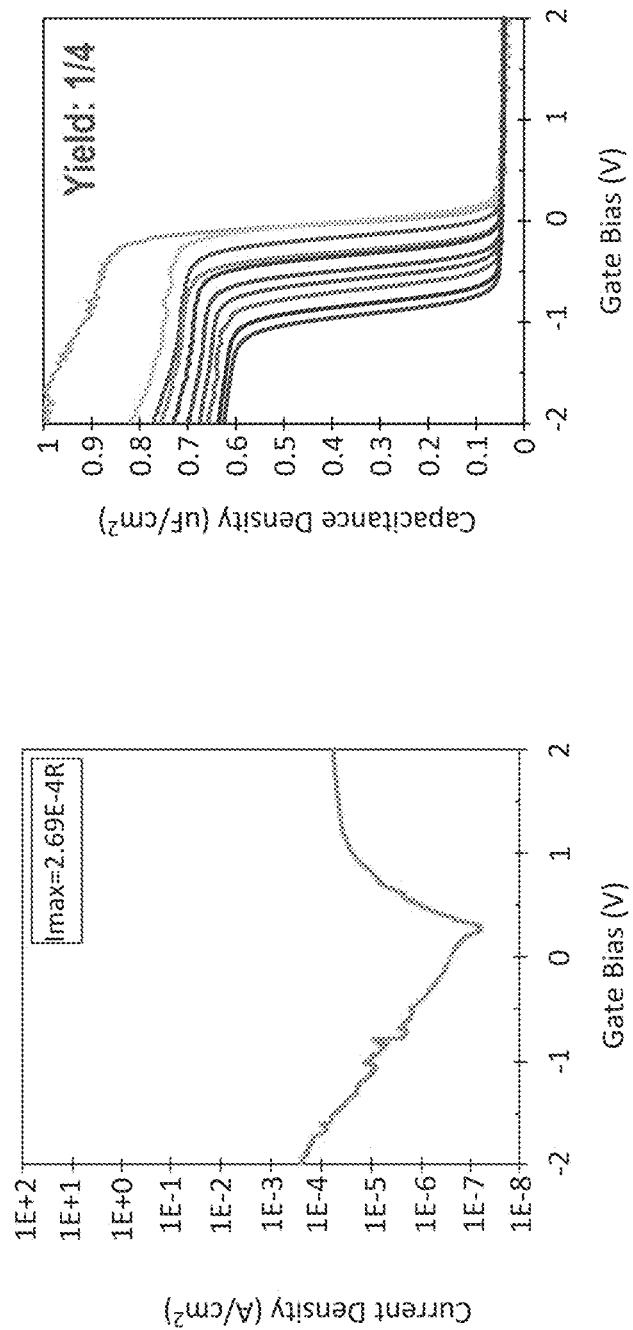
FIG. 5 shows the capacitance-voltage characteristics of the estimated 5 nm of BN on SiGe device, along with the corresponding leakage characteristics after a forming gas anneal.

FIG. 5 shows the capacitance-voltage characteristics of the estimated 5 nm of BN on SiGe device, along with the corresponding leakage characteristics after a forming gas anneal. Although there is a large frequency dispersion in the C—V indicative of trap states, the I-V shows low leakage consistent with a pin-hole free film. Note these MOSCAP were fabricated with less than saturated ALD pulses so better MOSCAPs could be fabricated with properly saturated ALD pulses.

FIG. 5: Capacitance vs voltage plot and current vs voltage plot shows the low leakage of the 5 nm BN sample on top of SiGe after a forming gas anneal.

Figure 6:
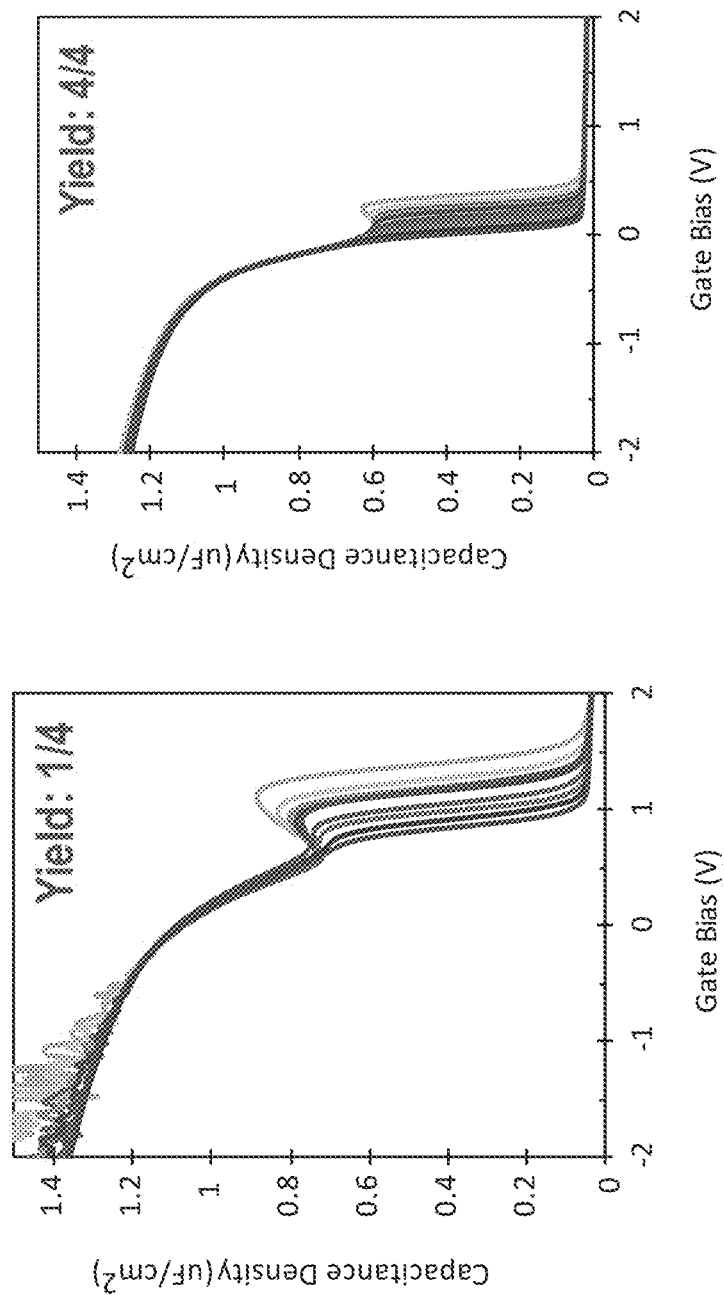
FIG. 6 shows the capacitance vs voltage performance of the 0.5 nm interfacial BN layer on SiGe with 40 cycles of $Al_2O_3$ versus a reference sample without an interfacial layer.

FIG. 6 shows the capacitance vs voltage performance of the 0.5 nm interfacial BN layer on SiGe with 40 cycles of $Al_2O_3$ versus a reference sample without an interfacial layer. The top contact is thermal Ni, and the back contact is sputtered Al. There is lower Dit bump seen along with a higher yield of devices. Note this was a non-optimized $Al_2O_3$ ALD, so better results could be expect with an optimized $Al_2O_3$ ALD process. In addition, the BN layer was formed with less than saturated ALD pulses, so better MOSCAPs could be fabricated with properly saturated ALD pulses FIG. 7: Scanning Tunneling Microscopy (STM) 200 nm×200 nm image of 15 cycles of BN on HOPG. The corresponding line trace show feature heights on the order of 1 nm and feature widths on the order of 100 nm.

Figure 8:
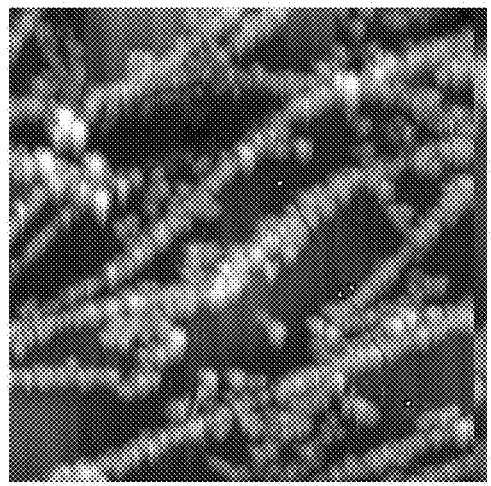
FIG. 8 shows Scanning Tunneling Microscopy (STM) 500 nm×500 nm (left) and 2000 nm×2000 nm (right) images of 30 cycles of BN on HOPG.
Figure 8:
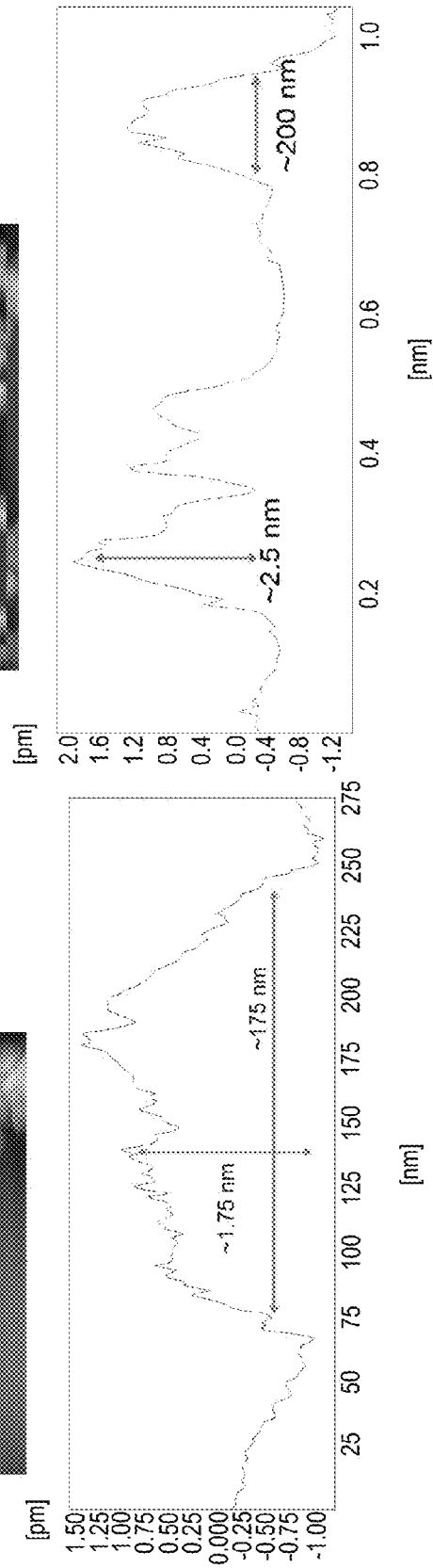

FIG. 8: Scanning Tunneling Microscopy (STM) 500 nm×500 nm (left) and 2000 nm×2000 nm (right) images of 30 cycles of BN on HOPG. The corresponding line traces show feature heights on the order of 2 nm and feature widths on the order of 200 nm.

Figure 9:
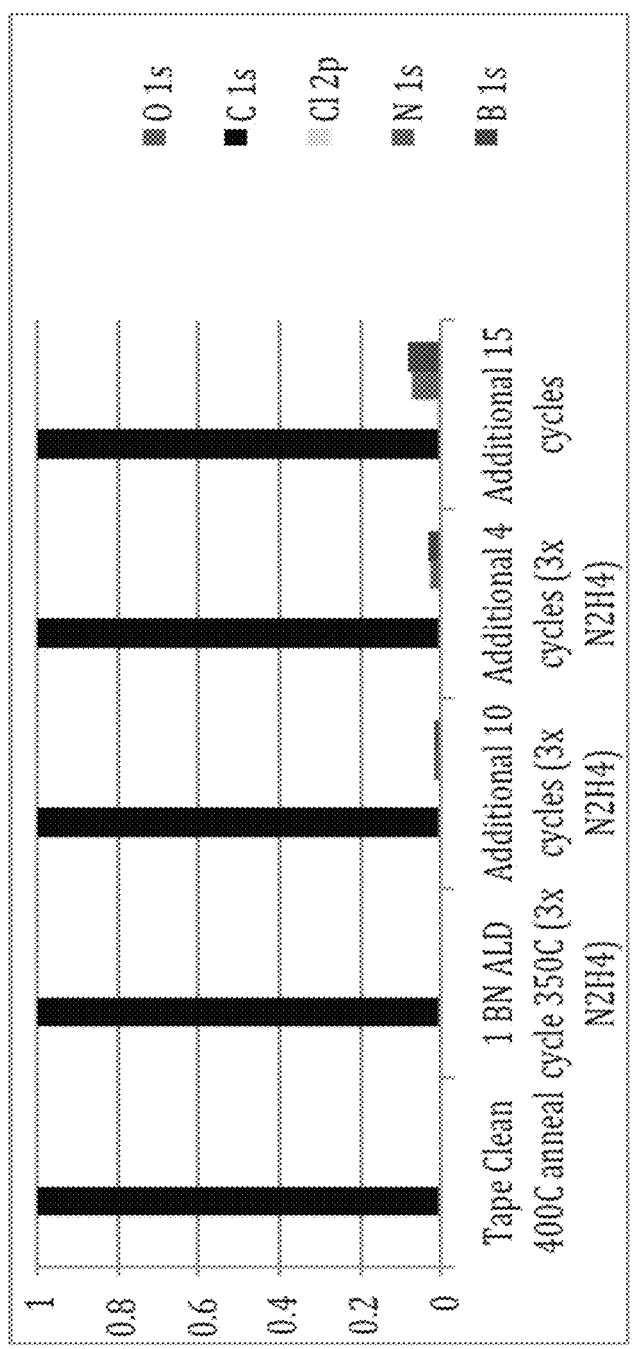
FIG. 9 shows XPS normalized peak areas of BN cycles on HOPG after 1, an additional 10, an additional 4 and an additional 15 cycles.

FIG. 9: XPS normalized peak areas of BN cycles on HOPG after 1, an additional 10, an additional 4 and an additional 15 cycles.

Figure 10:
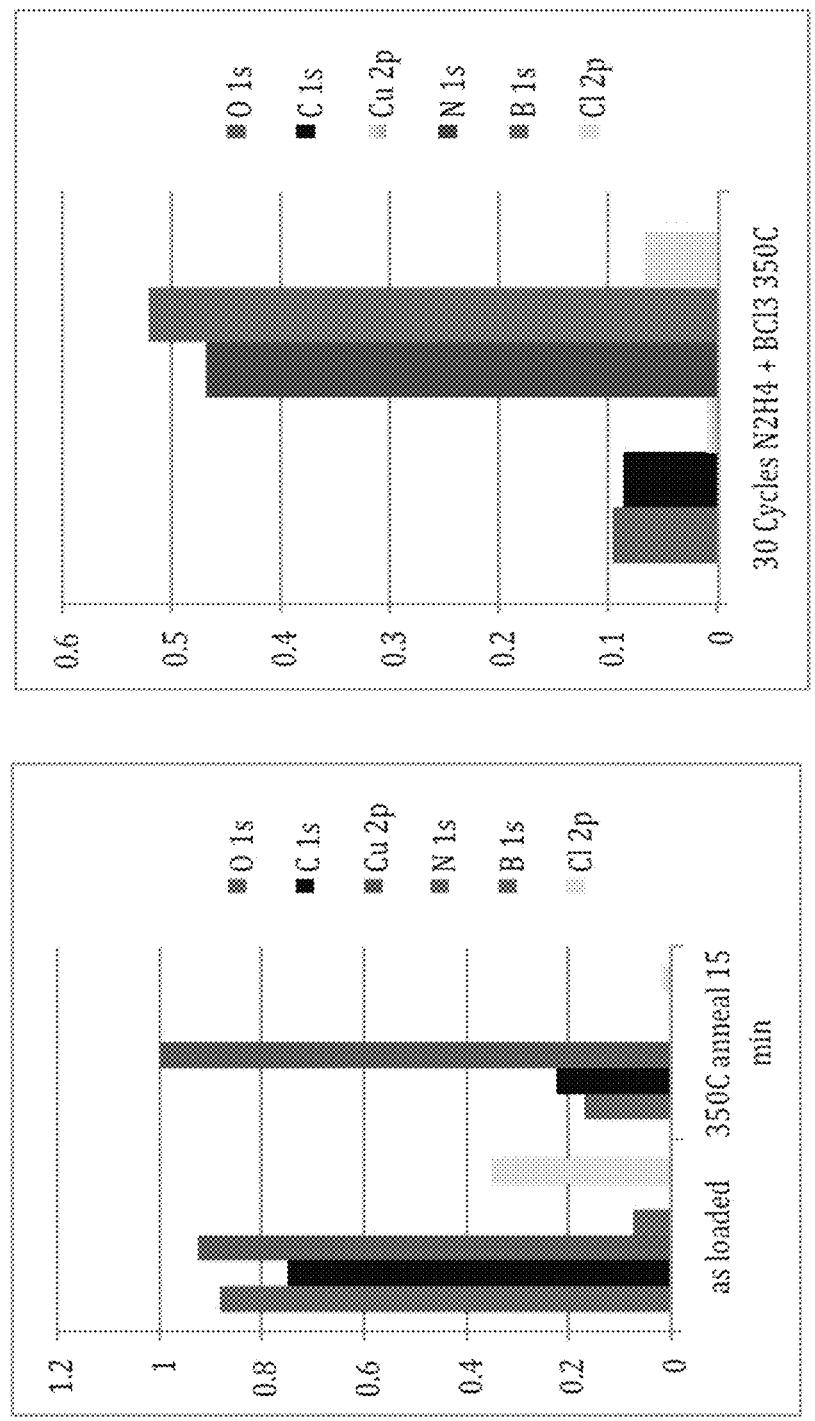
FIG. 10 shows XPS corrected peak areas normalized to the sum of Cu 2p+N 1 s+B 1 s accounting for inelastic mean free paths of an ex-situ cleaned "as loaded" copper substrate, after a 350 C anneal, and after 30 BN cycles at 350 C.

FIG. 10: XPS corrected peak areas normalized to the sum of Cu 2p+N 1 s+B 1 s accounting for inelastic mean free paths of an ex-situ cleaned "as loaded" copper substrate, after a 350 C anneal, and after 30 BN cycles at 350 C.

Figure 11:
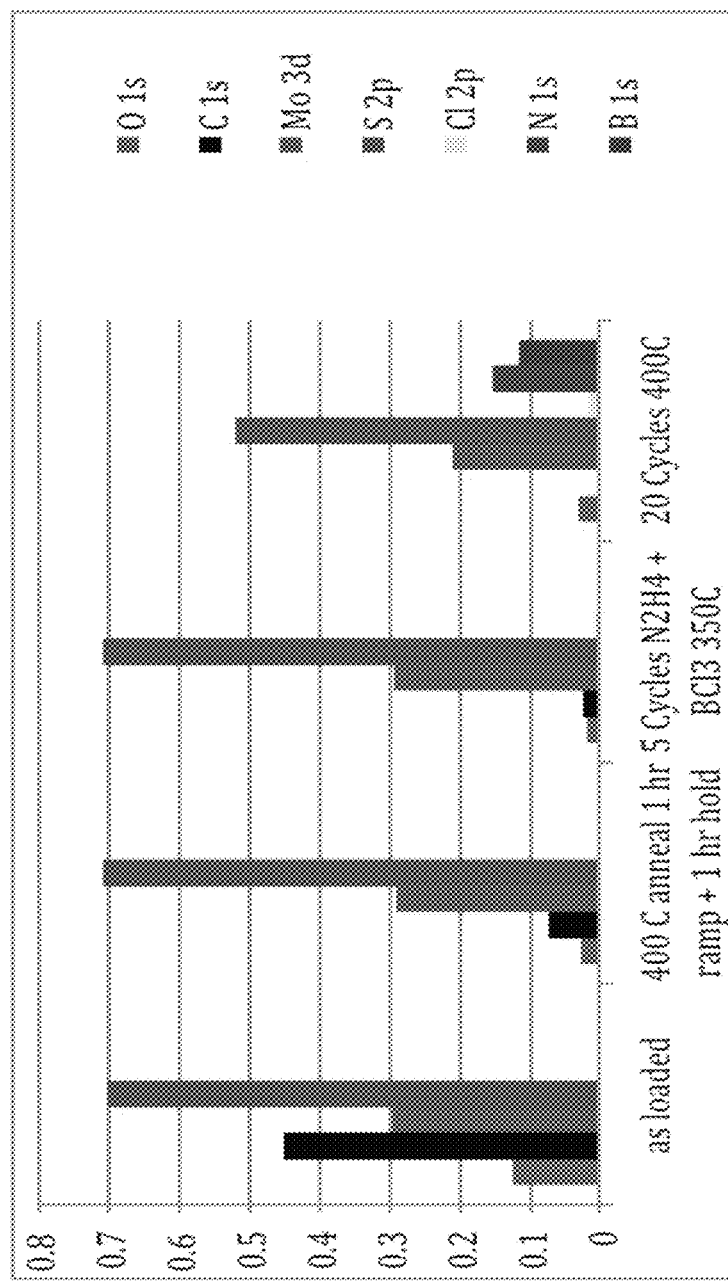
FIG. 11 shows XPS corrected peak areas normalized to the sum of Mo 3 d+S 2p+B 1 s+N 1 s of an "as loaded" $MoS_2$ substrate, after a 400 C anneal to remove contamination, after 5 BN cycles at 350 C, and after 20 more cycles at 400 C.

FIG. 11: XPS corrected peak areas normalized to the sum of Mo 3 d+S 2p+B 1 s+N 1 s of an "as loaded" $MoS_2$ substrate, after a 400 C anneal to remove contamination, after 5 BN cycles at 350 C, and after 20 more cycles at 400 C.

The experimental self-limiting atomic layer deposition procedure is based upon sequential exposures to a reactive nitrogen-containing precursor ($N_2H_4$ in our case) and a boron containing precursor ($BCl_3$, $BBr_3$, $BF_3$, $B_2H_6$, $(BH)_3(NH)_3$, TDMAB). During the first half-cycle reaction of the substrate with $N_2H_4$, the surface terminates in N-$H_x$ groups. During the second half cycle, exposure with the boron containing precursor ($BCl_3$ is the only precursor we have tested), boron is added to the surface while a gaseous byproduct (HCl for $BCl_3$) is formed. The surface reaction saturates when all surface hydrogen has reacted, and the surface is left terminated with B-Cl groups. Upon the next exposure to $N_2H_4$, nitrogen is added to the surface again with the formation of a second gaseous byproduct (for example H-Cl) that is pumped away. Similarly, the half-cycle reaction is completed when all surface Cl has been reacted. Continued sequential exposures have shown that films upwards of 5 nm of nearly stoichiometric BN can be formed on SiGe with very minimal contamination. It is noted that on some substrates, the boron containing precursor will be more effective at nucleating the ALD (for example $BCl_3$) than the $N_2H_4$ depending on if the substrate is electrophilic or nucleophilic. For example, on HOPG, the data is most consistent with ALD being nucleated by catalytic dissociation of $BCl_3$ at step edges.

Anhydrous $N_2H_4$, courteous of Rasirc, Inc. was employed in these studies to prevent unwanted oxygen contamination during film deposition. A source containing the anhydrous hydrazine was charged with ultra-pure nitrogen to a pressure of 760 Torr, with subsequent pulses using the headspace $N_2H_4/N_2$ gas mixture. Similarly, semiconductor grade (99.999% pure, Praxair) $BCl_3$ was used to deposit contamination-free films. The self-limiting atomic layer deposition procedure can be seen in FIG. 1 with the help of monochromatic aluminum channel x-ray photoelectron spectroscopy (XPS) spectrum collected on the surface at a glancing angle of 30°. A SiGe wafer that has undergone a hydrogen clean to remove most surface contamination (oxygen and carbon), is shown in the first column. The clean surface was subsequently dosed with 5 cycles of alternating exposure of $N_2H_4$ and $BCl_3$ at a sample temperature of 350° C. Each of these first 5 cycles consists of 150 MegaLangmuir (ML) exposure to $N_2H_4$ and 150 ML exposure to $BCl_3$ per cycle; no carrier gas was employed but could be in the future. To prove saturation of the ALD cycles, additional $BCl_3$ was dosed (additional 150 ML and additional 300 ML), which adds additional boron to the surface. The percentage of boron goes from 5.4% to 6.2% to 6.3%. The boron is virtually unchanged after the large exposure to $BCl_3$ and can be concluded to saturate. In a similar fashion, the nitrogen goes from 11.6% to 12.5% to 12.8% after additional exposures to $N_2H_4$. This demonstrates the saturation of the $N_2H_4$ half cycle. A more perfect ALD cycle is achieved by the reduction of the Cl 1 s signal. This procedure outlines the nearly saturating ALD procedure: 450 ML of $N_2H_4$ and 300 ML of $BCl_3$ per cycle.

Figure 7:
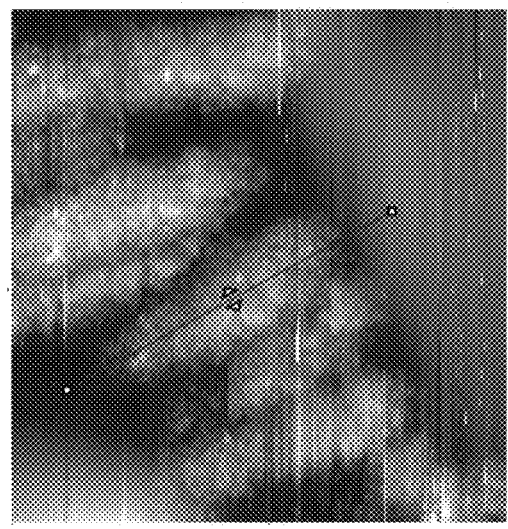
FIG. 7 shows a Scanning Tunneling Microscopy (STM) 200 nm×200 nm image of 15 cycles of BN on HOPG.
Figure 7:
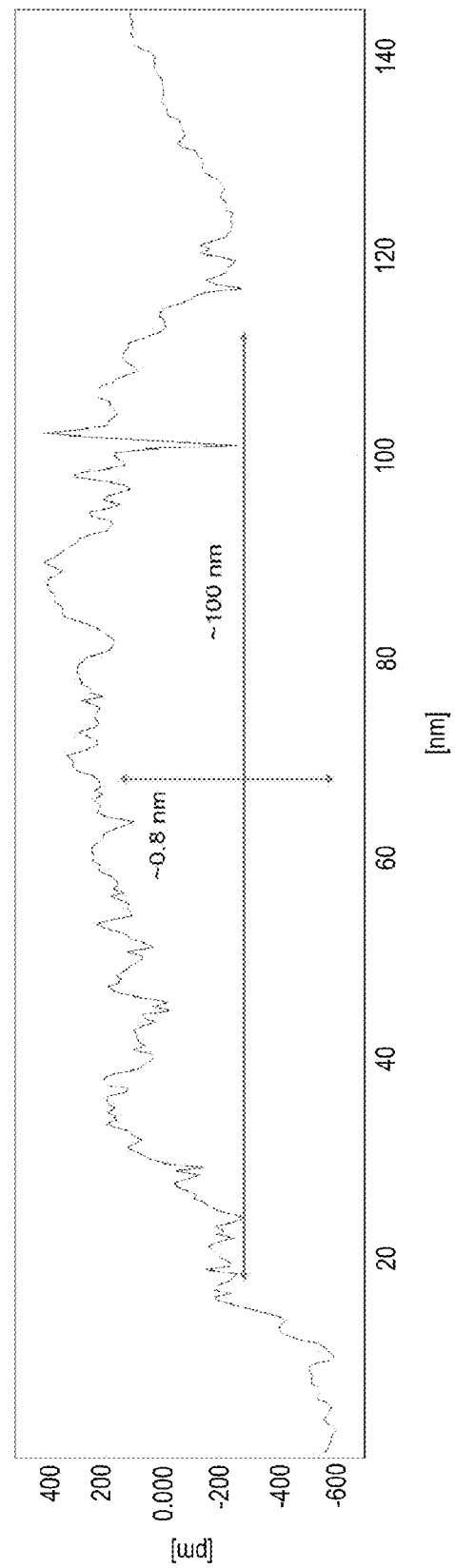

All above data has discussed BN on SiGe. The following data discusses BN on HOPG. BN is isoelectronic to HOPG but has different electronic properties. Therefore, there has been research into depositing BN on HOPG to tune the electronic properties of devices, as well as gain the advantageous properties of BN. FIG. 7 shows a 200×200 nm STM image and corresponding line trace of the surface after 15 BN ALD cycles at 350° C. with feature heights on the order of 1 nm and widths on the order of 100 nm. FIG. 8 shows two STM images with corresponding line traces after a total of 30 cycles of BN ALD on HOPG at 350° C. The line traces show that the feature heights are about 1.5-2.5 nm tall with the feature widths on the order of 100-300 nm. Note, saturation doses have not been performed yet. The BN seems to nucleate at the step edges of HOPG; the data is most consistent with the nucleation being caused by BCl3 dissociation since it is most reasonable the boron can freely diffuse across the surface. The STM image on the left shows row-like features that can be construed as a step edge. At the moment this is thought to be crystalline or polycrystalline BN that has deposited on HOPG. FIG. 9 shows the corresponding XPS results of the same sample. A BN film free of contamination was deposited BN deposition has also been performed on copper and $MoS_2$ substrates in a very similar manner as on SiGe and HOPG discussed above. FIG. 10 shows the XPS of as loaded copper plus an anneal to remove contamination from the surface, as well 30 cycles of BN deposition at 350 C. The as-received copper sample has contamination, so it undergoes an ex-situ wet clean consisting of 5 minute sonications in acetone, IPA, and water before being loaded into the UHV chamber. The 15 minute anneal at 350 C removes significant oxygen, carbon, and chlorine contamination. After 30 cycles of deposition again nearly stoichiometric is formed. As of this time, saturation studies have not been performed to confirm the ALD. Similarly, FIG. 11 shows deposition on $MoS_2$; however, the reaction did not appear to occur at 350 C. Thus, the temperature was increased to 400 C and 20 cycles were deposited, resulting in the attenuation of the substrate Mo 3 d and S 2 p signals, while increasing the B 1 s and N 1 s signals in XPS.

BN ALD layers of the disclosure can be used as an interfacial layer in a gate oxide stack, or as a diffusion barrier on copper interconnects in devices, which can help prevent the interconnect form overheating. Due to its small bond length, a-BN should provide a better diffusion barrier than even $Si_3N_4$ or metal nitrides. While $Si_3N_4$ can readily be deposited by CVD and plasma enhanced ALD, the a-BN can be deposited by thermal ALD in accordance with the disclosure at low temperature, e.g., ~350° C. or less, thereby providing a more conformal coating. Metal nitrides can be deposited by thermal ALD but these often require processing temperatures in excess of 350° C. while the ALD of a-BN can be done below 350° C. The-BN layer can be used in double, quadruple, etc. patterning since it can be deposited conformally on a feature and would have selective etching with respect to semiconductors or oxides ($SiO_2$). While $Si_3N_4$ can readily be deposited by CVD and plasma enhanced ALD, the a-BN can be deposited by thermal ALD at ~350° C. or less thereby providing a more conformal coating. There is also application for depositing BN as a low dielectric material, or it can serve as a selective etching material. It also has high mechanical resistance to chemical mechanical polishing (CMP) slurries, so depositing BN can help act as CMP stop layer. The ALD deposition of boron nitride is applicable for use as a semiconductor interfacial layer in MOSCAP, MOSFET, and FinFET device architectures. This interfacial layer can act as a surface protection layer from unwanted oxidation or surface contamination or act as diffusion barrier layer from substrate out-diffusion into the oxide. This application will serve useful during deposition and processing of gate stacks on FinFETs for MOSFETs.

While specific embodiments of the present disclosure have been shown and described, it should be understood that other modifications, substitutions and alternatives are apparent to one of ordinary skill in the art. Such modifications, substitutions and alternatives can be made without departing from the spirit and scope of the disclosure.

Various features of the disclosure are set forth in the appended claims.

REFERENCES

The following references are hereby incorporated by reference in their entirety to the extent not inconsistent with the present disclosure.

1. Snure, M., et al., *Optical characterization of nanocrystalline boron nitride thin films grown by atomic layer deposition*. Thin Solid Films, 2014. 571, Part 1: p. 51-55.

2. Ferguson, J., A. Weimer, and S. George, *Atomic layer deposition of boron nitride using sequential exposures of $BCl_3$ and $NH_3$*. Thin Solid Films, 2002. 413(1): p. 16-25.

3. Olander, J., et al., *Laser-Assisted Atomic Layer Deposition of Boron Nitride Thin Films*. Chemical Vapor Deposition, 2005. 11(6-7): p. 330-337.

4. Mårlid, B., et al., *Atomic layer deposition of BN thin films*. Thin Solid Films, 2002. 402(1): p. 167-171.

5. Ahn, J. Y., et al., *Insulating layers in semiconductor devices having a multi-layer nanolaminate structure of SiNx thin film and BN thin film and methods for forming the same*. 2003, Google Patents.

6. Kim, Y. S., et al., *Method for forming a thin film using an atomic layer deposition (ALD) process*. 2004, Google Patents.

7. Haider, A., et al., *Low-Temperature Deposition of Hexagonal Boron Nitride via Sequential Injection of Triethylboron and N2/H2 Plasma*. Journal of the American Ceramic Society, 2014. 97(12): p. 4052-4059.

8. Cassabois, G., P. Valvin, and B. Gil, *Hexagonal boron nitride is an indirect bandgap semiconductor*. arXiv preprint arXiv:1512.02962, 2015.

9. Bath, A., et al., *Plasma enhanced chemical vapor deposition and characterization of boron nitride gate insulators on InP*. Journal of Applied Physics, 1991. 70(8): p. 4366-4370.

10. Liu, Z., et al., *Direct Growth of Graphene/Hexagonal Boron Nitride Stacked Layers*. Nano Letters, 2011. 11(5): p. 2032-2037.

The invention claimed is:

1. A method for atomic layer deposition (ALD) of boron nitride, the method comprising:
   placing a 2-dimensional semiconductor substrate in an ALD reactor, the 2-dimensional semiconductor substrate comprising highly ordered pyrolytic graphite (HOPG);
   heating the substrate to a deposition temperature of about 350° C. or less; and
   sequentially exposing the substrate to a reactive nitrogen containing precursor and a boron containing precursor.

2. The method of claim 1, wherein the reactive nitrogen containing precursor comprises hydrazine ($N_2H_4$).

3. The method of claim 2, wherein the boron containing precursor comprises one of $BCl_3$, $BBr_3$, $BF_3$, $B_2H_6$, borazine $(BH)_3(NH)_3$, tris(dimethylamino)borane (TDMAB) and organometallic boron compounds.

4. The method of claim 1, wherein the boron containing precursor comprises one of $BCl_3$, $BBr_3$, $BF_3$, $B_2H_6$, borazine $(BH)_3(NH)_3$, tris(dimethylamino) borane (TDMAB) and organometallic boron compounds.

5. The method of claim 1, wherein the substrate comprises a metal interconnect.

6. The method of claim 1, wherein the substrate comprises a ceramic.

7. The method of claim 1, comprising a plurality of sequential exposures at ~350° C. or less followed by a plurality of sequential exposures at ~400° C.

8. The method of claim 1, wherein ~350° C. or less comprises temperatures below 350° C. sufficient to react the nitrogen containing precursor and a boron containing precursor.

9. A semiconductor device, the device comprising:
   a 2-dimensional semiconductor substrate comprising highly ordered pyrolytic graphite (HOPG);
   a thin, uniform and pin-hole free interfacial layer of boron nitride; and
   a dielectric deposited on the interfacial layer.

10. The device of claim 9, wherein the dielectric comprises one of $Al_2O_3$, $HfO_2$, $ZrO_2$, or HfZrO.

11. The device of claim 9, wherein the dielectric is a gate oxide material.

12. The device of claim 9, wherein the layer of boron nitride has a thickness of approximately 0.5 nm.

* * * * *

UNITED STATES PATENT AND TRADEMARK OFFICE
CERTIFICATE OF CORRECTION

PATENT NO. : 10,297,441 B2
APPLICATION NO. : 15/674108
DATED : May 21, 2019
INVENTOR(S) : Steven Wolf et al.

Page 1 of 2

It is certified that error appears in the above-identified patent and that said Letters Patent is hereby corrected as shown below:

In the Specification

In Column 2, Line 20, delete "Cu 2p+N 1 s+B 1 s" and insert -- Cu 2p+N 1s+B 1s --, therefor.

In Column 2, Line 24, delete "Mo 3 d+S 2p+B 1 s+N 1 s" and insert -- Mo 3d+S 2p+B 1s+N 1s --, therefor.

In Column 2, Line 48, delete "antiminide" and insert -- antimonide --, therefor.

In Column 3, Line 20, delete "Si 2p+Ge 3 d+N 1 s+B 1 s" and insert -- Si 2p+Ge 3d+N 1s+B 1s --, therefor.

In Column 3, Line 30, delete "N 1 s" and insert -- N 1s --, therefor.

In Column 3, Lines 30-31, delete "B 1 s" and insert -- B 1s --, therefor.

In Column 3, Lines 32-33, delete "B 1 s and N 1 s" and insert -- B 1s and N 1s --, therefor.

In Column 4, Line 17, delete "Cu 2p+N 1 s+B 1 s" and insert -- Cu 2p+N 1s+B 1s --, therefor.

In Column 4, Line 21, delete "Mo 3 d+S 2p+B 1 s+N 1 s" and insert -- Mo 3d+S 2p+B 1s+N 1s --, therefor.

In Column 4, Line 28, delete "(BCl₃," and insert -- (BCl$_3$, --, therefor.

In Column 4, Line 32, delete "(BCl₃" and insert -- (BCl$_3$ --, therefor.

In Column 4, Line 34, delete "(HCl or BCl₃)" and insert -- (HCl or BCl$_3$) --, therefor.

In Column 4, Line 36, delete "B-Cl" and insert -- B-Cl --, therefor.

Signed and Sealed this
Twenty-third Day of July, 2019

Andrei Iancu
*Director of the United States Patent and Trademark Office*

CERTIFICATE OF CORRECTION (continued)
U.S. Pat. No. 10,297,441 B2

In Column 4, Line 39, delete "H-Cl)" and insert -- H-Cl) --, therefor.

In Column 4, Line 40, delete "Cl" and insert -- Cl --, therefor.

In Column 4, Line 46, delete "BCl$_3$)" and insert -- BCl$_3$) --, therefor.

In Column 4, Line 49, delete "BCl$_3$" and insert -- BCl$_3$ --, therefor.

In Column 5, Line 11, delete "1 s" and insert -- 1s --, therefor.

In Column 5, Line 36, after "deposited" insert -- . --.

In Column 5, Line 53, delete "Mo 3 d and S 2 p" and insert -- Mo 3d and S 2p --, therefor.

In Column 5, Line 54, delete "1 s and N 1 s" and insert -- 1s and N 1s --, therefor.

In the Claims

In Column 7, Line 20, in Claim 4, delete "tris(dimethylamino) borane" and insert -- tris(dimethylamino)borane --, therefor.

In Column 8, Line 18, in Claim 10, delete "Al$_2$0$_3$, Hf0$_2$, Zr0$_2$," and insert -- Al$_2$O$_3$, HfO$_2$, ZrO$_2$, --, therefor.+